(12) United States Patent
Knudsen

(10) Patent No.: US 7,485,976 B2
(45) Date of Patent: Feb. 3, 2009

(54) TAMPER RESISTANT PACKAGING AND APPROACH

(75) Inventor: Carl Knudsen, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 435 days.

(21) Appl. No.: 10/538,454

(22) PCT Filed: Dec. 15, 2003

(86) PCT No.: PCT/IB03/05954

§ 371 (c)(1), (2), (4) Date: Jun. 10, 2005

(87) PCT Pub. No.: WO2004/055822

PCT Pub. Date: Jul. 1, 2004

(65) Prior Publication Data

US 2006/0108668 A1   May 25, 2006

Related U.S. Application Data

(60) Provisional application No. 60/434,520, filed on Dec. 18, 2002.

(51) Int. Cl.
G08B 1/08 (2006.01)

(52) U.S. Cl. .................. 257/922; 257/798; 257/659; 257/660; 257/E23; 257/701; 257/702; 257/724; 257/736; 257/782; 713/194; 340/539.31

(58) Field of Classification Search .......... 257/798, 257/922, 679, 659, 660, E23
See application file for complete search history.

(56) References Cited

U.S. PATENT DOCUMENTS

| 6,194,888 | B1 * | 2/2001 | Matsumoto et al. | 323/364 |
| 6,404,674 | B1 * | 6/2002 | Anthony et al. | 365/173 |
| 2001/0005011 | A1 * | 6/2001 | Minakata et al. | 257/1 |
| 2001/0033012 | A1 * | 10/2001 | Kommerling et al. | 257/679 |

OTHER PUBLICATIONS

"Self-Destructing Diskette" IBM Technical Disclosure Bulletin (Jun. 1, 1990): 218-219.*

* cited by examiner

Primary Examiner—Leonardo Andújar
Assistant Examiner—Fei Fei Yeung Lopez
(74) Attorney, Agent, or Firm—Peter Zawilski

(57) ABSTRACT

A tamper-resistant packaging approach protects non-volatile memory. According to an example embodiment of the present invention, an array of magnetic memory elements (130-132) in an integrated circuit (100) are protected from magnetic flux (122) by a package (106) including a magnet (120). Flux from the magnet is directed away from the magnetic memory elements by the package. When tampered with, such as by removal of a portion of the package for accessing the magnetic memory elements, the package allows the flux to reach some or all of the magnetic memory elements, which causes a change in a logic state thereof. With this approach, the magnetic memory elements are protected from tampering.

22 Claims, 3 Drawing Sheets

TAMPER RESISTANT PACKAGING AND APPROACH

CROSS REFERENCE TO RELATED APPLICATION

This application claims the benefit of U.S. provisional application Ser. No. 60/434,520 filed 18 Dec. 2002, which is incorporated herein by reference.

The present invention is directed to device packaging and, more particularly, to tamper-resistant packaging for items such as integrated circuits.

Packaging plays an important role in product protection and security. For instance, in electronics and software applications, packaging is important for ensuring that products are kept free from damage and are not tampered with. Tamper-prevention has been particularly important in applications where information stored within a particular package is proprietary. For example, in memory applications, it is sometimes desirable to prevent access to data stored in a circuit.

A variety of approaches to protecting stored data have been used. For example, in SRAM applications, memory is lost when power is removed from the circuitry used to store data. Power is removed when tampering is detected, thus erasing the stored data. When these approaches involve battery backup, the battery power is also removed in response to tampering.

In other memory applications, power is not necessarily required for storing data. For example, in magnetic memory applications, memory is stored in a manner that does not require power to maintain the memory and thus is non-volatile. Certain types of magnetic memory cells that use the magnetic state of a region for altering the electrical resistance of materials located near the region are collectively known as magnetoresistive (MR) memory cells. An array of magnetic memory cells is often called a magnetic random access memory (MRAM). In MRAM applications, memory cells are typically formed on intersections of word lines and sense lines, with each memory cell typically having magnetic layers separated by a conductive or insulating layer. Magnetoresistive metals used in such memory applications show a change in electrical resistance when placed in a magnetic field. In this regard, the MRAM cell has two stable magnetic configurations, one having high resistance and the other low resistance (e.g., with high resistance representing a logic state zero and low resistance representing a logic state one). The magnetic state (i.e., magnetic charge) of the device is manipulated and read as data, such that the read can be effected using an instrument to probe an integrated circuit on which the MRAM cell is located.

Protecting memory in applications such as MRAM that do not necessarily require power to maintain memory has been challenging, however, because typical approaches involving power-related tamper protection do not work. Specifically, removing power does not cause memory loss. These and other difficulties present challenges to the implementation of tamper-protection and packaging for MRAM and other types of applications.

Various aspects of the present invention involve tamper protection for non-volatile memory circuits, such as MRAM. The present invention is exemplified in a number of implementations and applications, some of which are summarized below.

According to an example embodiment of the present invention, a magnetically-responsive circuit element is protected from tampering therewith by a packaging arrangement adapted to selectively inhibit a magnetic field from reaching the magnetically-responsive circuit element. The package includes a chip-surrounding magnetic arrangement that creates a magnetic flux surrounding the chip. Specifically, the package inhibits a magnetic field from reaching the magnetically-responsive circuit element when intact. Upon tampering with the package, for example, to probe the data stored in the package-contained chip, the breach in the package results in a reduction or elimination of the magnetic field inhibition characteristics. Consequently, the chip-surrounding magnetic arrangement, at least in certain regions, provides a sufficiently-strong magnetic force that its fringes reach and alter the state of the magnetically-responsive circuit element. With this approach, the magnetic state of the magnetically-responsive circuit arrangement cannot necessarily be detected upon tampering (e.g., removal) of the package.

According to another example embodiment of the present invention, an integrated circuit arrangement that is susceptible to data corruption caused by a local magnetic field contains a data-storage arrangement and an integrated circuit package. The package includes a chip-surrounding magnetic arrangement that creates a magnetic flux surrounding the chip. The data-storage arrangement includes a plurality of mini magnets which store logic states in response to electrical control signals. The package conducts the local magnetic field, which is generated by a magnetic device included in the package, away from the mini magnets. Piercing the package interrupts the surrounding magnetic field which, in turn, self-inflicts an alteration to data stored by the mini magnets.

According to another related example embodiment of the present invention, a magnetically-responsive integrated circuit memory arrangement is comprised of a plurality of mini magnets. Each of the mini magnets is adapted to store a logical state as a function of the magnet's magnetic state. The memory arrangement also includes a plurality of word lines wherein each mini magnet is magnetically responsive to a signal applied to a word line for setting a magnetic state of the mini magnet. Sensing circuits exhibiting a detectable electrical characteristic as a function of the magnetic state of a mini magnet are read to determine the logical state stored in the mini magnet. An integrated circuit package which includes a magnetic device that generates the local magnetic field, is adapted to direct the local magnetic field away from the mini magnets. In response to the removal of a portion of the package, the package, mini magnets, and magnetic device are arranged so that the local magnetic field sets and/or alters the magnetic state of at least one of the mini magnets.

The above summary of the present invention is not intended to describe each embodiment or every implementation of the present invention. The above summary of the present invention is not intended to describe each illustrated embodiment or every implementation of the present invention. The figures and detailed description that follow more particularly exemplify these embodiments.

The invention may be more completely understood in consideration of the following detailed description of various embodiments of the invention in connection with the accompanying drawings, in which.

Figure 1:
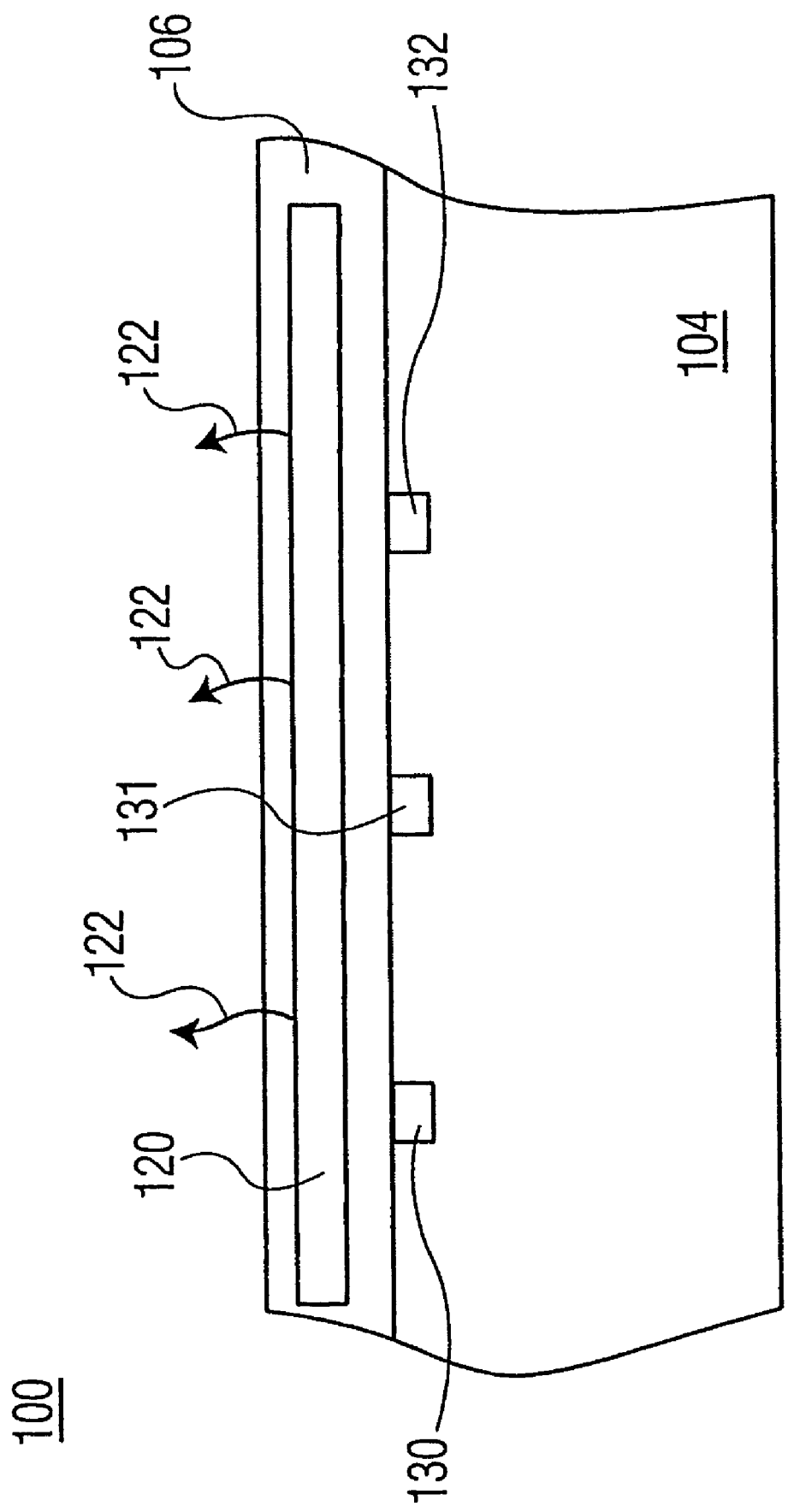
FIG. 1 is an integrated circuit device adapted for inhibiting tampering, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of circuits and approaches involving and/or benefiting from tamper protection, and in particular to non-volatile and other integrated circuits that do not necessarily rely upon power for maintaining memory, such as MRAM circuits. While the present invention is not necessarily limited to such applications, an appreciation of various aspects of the invention is best gained through a discussion of examples in such an environment.

According to an example embodiment of the present invention, a magnetically-responsive circuit arrangement protects data stored in a magnetically-responsive circuit element from tampering therewith by a packaging arrangement adapted to selectively inhibit a magnetic field from reaching the magnetically-responsive circuit element. The magnetically-responsive circuit arrangement includes magnetically-responsive articles which store logic states in response to electrical control signals. Specifically, the package inhibits a magnetic field from reaching the magnetically-responsive circuit element when intact by conducting the local magnetic field generated by a magnetic device in the package away from the magnetically-responsive articles. Upon tampering, however, the package reduces or eliminates its magnetic field inhibition characteristics, thereby causing the magnetic field to reach the magnetically-responsive circuit element which, in response to the magnetic field, set and/or alters a magnetic state. With this approach, the magnetic state of the magnetically-responsive circuit arrangement cannot necessarily be detected upon tampering (e.g., removal) of the package and the setting or the alteration of the magnetic state in the magnetically-responsive circuit element can be used to destroy data integrity and frustrate the access attempt.

FIG. 1 shows an integrated circuit device 100 having a substrate 104 covered by a package 106 adapted for inhibiting a magnetic field from reaching circuit elements in the substrate, according to another example embodiment of the present invention. The substrate 104 includes a plurality of magnetically-responsive circuit elements, including elements 130, 131 and 132, that are adapted for storing data as a function of a magnetic state thereof. Each of the plurality of magnetically-responsive circuit elements includes an MRAM-type circuit element and is coupled to other circuitry (not shown) for controlling the state of the MRAM-type circuit element for writing purposes, and for detecting the magnetic state of the MRAM-type circuit element for reading purposes. The package 106 is arranged such that the circuit elements in the substrate 104 are not directly accessible, for example, using probing or other access techniques for detecting characteristics of the circuit elements, such as the logic state thereof.

In one implementation, the magnetic state of the magnetically-responsive circuit elements is controlled to be one of two states, with a first state being characterized by a high resistance and a second state being characterized by a low resistance. When data is to be written to one of the magnetically-responsive circuit elements, a magnetic field is applied thereto and used to set the magnetic state thereof. When data is to be read, the resistance of the magnetically-responsive circuit element is detected and used to identify a logic state, for example, with a high resistance being correlated to a logical "ZERO" and a low resistance being correlated to a logical "ONE."

The package 106 includes a magnet element 120 that emits a magnetic flux, represented by arrows 122 and, with the package containing sufficient magnetic material in other (not shown) regions, the magnetic flux is directed to surround the substrate 104. The magnetic flux 122 is shown being directed away from the substrate 104 by material in the package 106. While the package 106 remains intact (e.g., not having been removed, altered or otherwise tampered with), the magnetic flux 122 is inhibited by the package from reaching one or more of the plurality of magnetically-responsive circuit elements 130, 131 or 132 (or others, not shown, in the substrate 104). Once the package 106 is tampered with, the magnetic flux 122 is sufficiently strong that its fringes can reach one or more of the magnetically-responsive circuit elements and cause a change in the magnetic state thereof.

Figure 2:
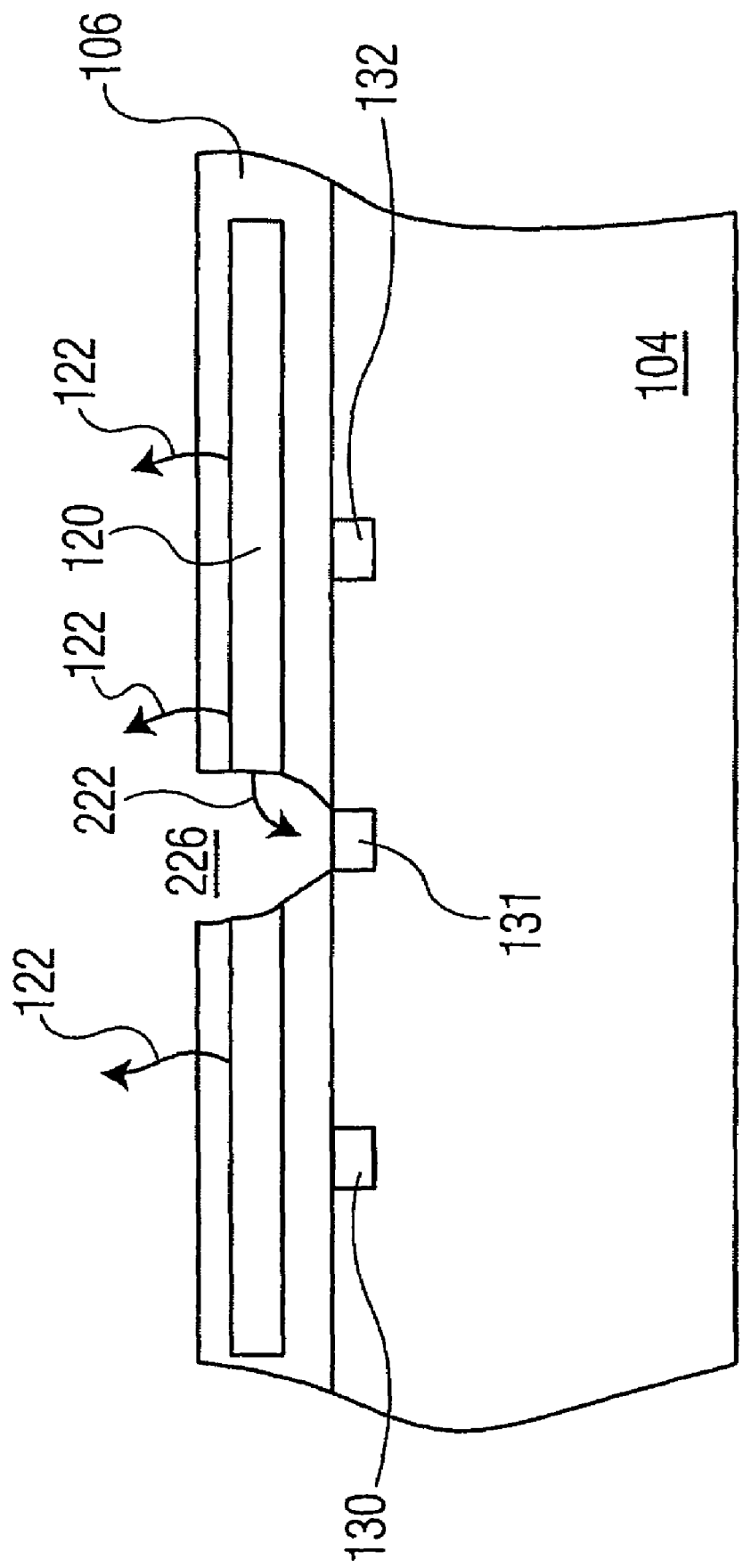
FIG. 2 shows the integrated circuit device of FIG. 1 responding to tampering, according to another example embodiment of the present invention.

Referring now to FIG. 2, one particular implementation of the device 100 shown in FIG. 1 is shown, with the package 106 being tampered with in a manner that includes removing a portion thereof, resulting in an opening 226 in a portion of the package 106. In this implementation, portions of the package 106 that are adapted for inhibiting the magnetic flux 122 from reaching the magnetically-responsive circuit element 131 have been removed. This tampering allows the magnetic flux 122 to reach the circuit element 131, which causes the magnetically-responsive circuit element 131 to take on a particular magnetic state effected by the flux. In this regard, the magnetic state of the magnetically-responsive circuit element 131, prior to the magnetic flux 122 reaching the circuit element 131, cannot necessarily be ascertained due to the potential that the magnetic state has been changed by the flux. With this approach, data stored in the magnetically-responsive circuit element 131 is protected from discovery via tampering with the package 106.

Figure 3:
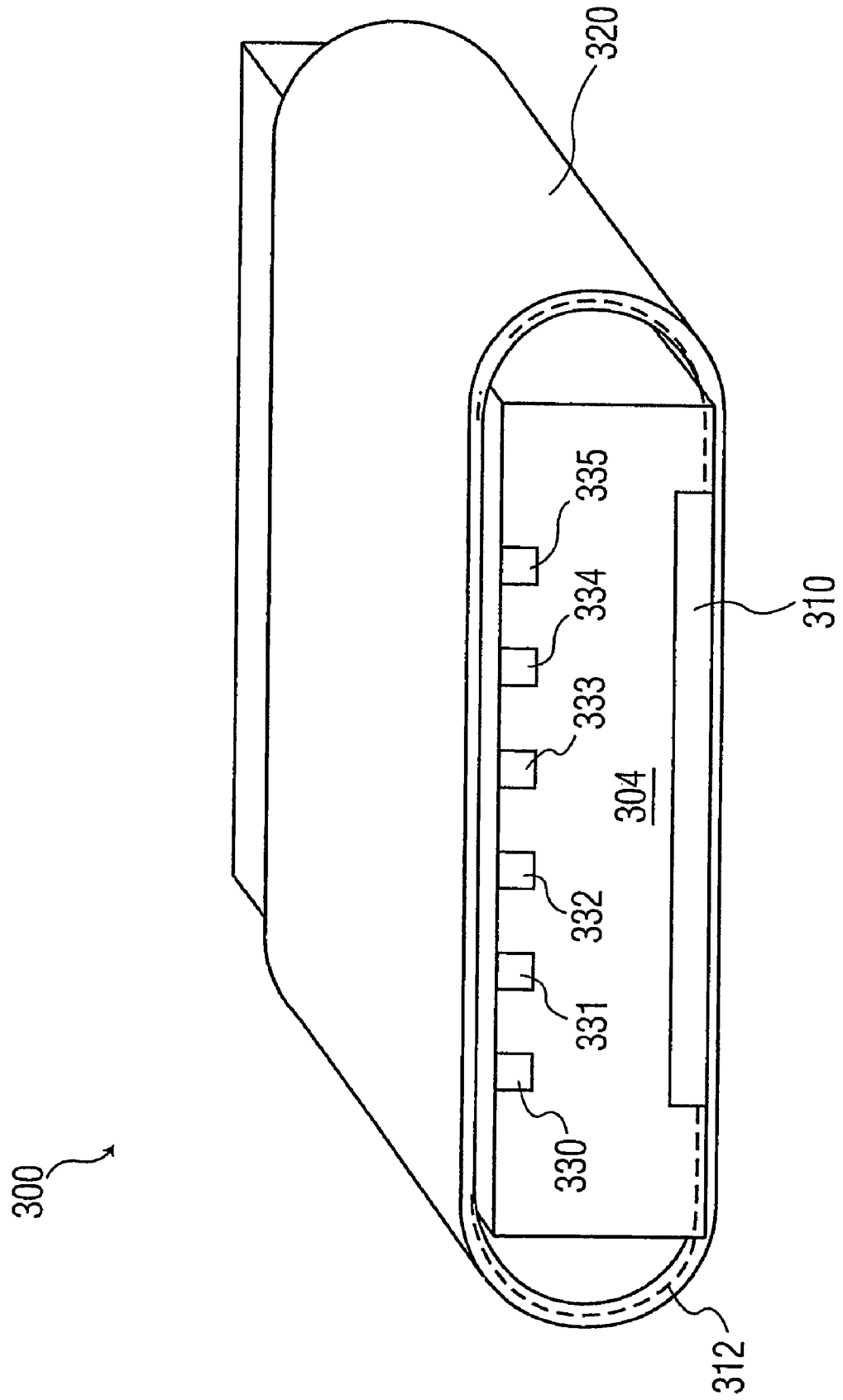
FIG. 3 shows an integrated circuit device having a package including a magnetic shield around, and a magnet below, an integrated circuit substrate, according to another example embodiment of the present invention.

Referring now to FIG. 3, another particular implementation and application of the present invention is depicted as integrated circuit arrangement 300. Integrated circuit arrangement 300 includes an MRAM-based chip die 304, a package magnet 310 (providing a relatively strong magnetic field), and a package 320 that surrounds the chip die 304. The package 320 includes a conventional magnetic shield 312 that protects and surrounds the MRAM's magnetically-responsive memory cells (mini magnets or elements) 330-335 from the typically-expected externally-generated magnetic fields. The magnetic shield 312 includes, or acts in concert with, the package magnet 310. The magnetic field of the package magnet 310 is aligned parallel to the easy axis of the MRAM circuit elements 330-335. The package is adapted to conduct the local magnetic field from the magnetic device away from the MRAM circuit elements 330-335.

Should the integrated circuit arrangement 300 be tampered with from above, e.g., such as the partial removal of the packaging to probe the data in the MRAM circuit elements 330-335, integrity of the data stored therein would be lost. This occurrence would be due either to the breach into the conventional magnetic shield 312 (and ensuing exposure to externally-generated magnetic fields) or by directly damaging the MRAM circuit elements 330-335.

Should such tampering occur from below, integrity of the data stored by the MRAM circuit elements 330-335 would be lost due to exposure thereto by the magnetic flux from the package magnet 310. Typically, such exposure would be through an air gap created by probing at the bottom side.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention that is set forth in the following claims.

What is claimed is:

1. An integrated circuit arrangement that is susceptible to data corruption caused by a local magnetic field, the integrated circuit arrangement comprising: an integrated circuit; a data-storage arrangement having a plurality of mini magnets adapted to store logic states in response to electrical control signals; and an integrated circuit package enclosing the integrated circuit and including a magnetic device adapted to generate the local magnetic field that is sufficiently strong to alter the logic state of at least one of the mini magnets in response to a portion of the magnetic device being removed.

2. The integrated circuit arrangement of claim 1, wherein the integrated circuit package and the magnetic device are arranged to direct the local magnetic field away from the plurality of mini magnets.

3. The integrated circuit arrangement of claim 2, wherein the magnetic device is adapted to exhibit a fringing magnetic field in response to a portion of the magnetic device being removed, the at least one of the plurality of mini magnets being exposed to the fringing field.

4. The integrated circuit arrangement of claim 1, wherein a portion of the local magnetic field of the magnetic device is aligned to an easy axis of the mini magnets.

5. The integrated circuit arrangement of claim 4, wherein the integrated circuit package includes a magnetic shield arrangement around the integrated circuit, and wherein the magnetic shield arrangement includes the magnetic device.

6. The integrated circuit arrangement of claim 5, wherein the integrated circuit has opposite-facing top and bottom sides, and wherein the magnetic device is located adjacent the bottom side and the mini magnets are located in the top side.

7. The integrated circuit arrangement of claim 6, wherein a fringing magnetic field from the magnetic device fringes out from the magnetic path in response to a portion of the magnetic device being removed.

8. The integrated circuit arrangement of claim 2, wherein the at least one of the plurality of mini magnets changes magnetic state in response to the local magnetic field from the magnetic device.

9. The integrated circuit arrangement of claim 2, wherein the at least one of the plurality of mini magnets changes polarity in response to the local magnetic field from the magnetic device.

10. The integrated circuit arrangement of claim 1, further comprising a sensing circuit adapted for resistively responding to a change in magnetic state of the at least one of the mini magnets.

11. The integrated circuit arrangement of claim 10, wherein the sensing circuit exhibits a first resistance in response to the at least one of the mini magnets being in a first state and exhibits a second resistance in response to the at least one of the mini magnets being in a second state.

12. The integrated circuit arrangement of claim 11, wherein the sensing circuit includes a transistor having a channel region exhibiting a conductance, the conductance of the channel region being responsive to the state of the mini magnet, wherein a current path through the channel exhibits the first and second resistances in response to the at least one of the mini magnets being in first and second states, respectively.

13. The integrated circuit arrangement of claim 1, wherein the data-storage arrangement is adapted to store a bit as a function of each of the plurality of mini magnets, the bit having a value that is directly related to a magnetic state of the mini magnets and, in response to the local magnetic field, the bit taking on a value of the magnetic state that is responsive to the local magnetic field.

14. The integrated circuit arrangement of claim 1, wherein at least a portion of the magnetic device is outside the integrated circuit package.

15. The integrated circuit arrangement of claim 1, wherein the integrated circuit package includes a magnetic shield, the integrated circuit package is in relatively close proximity to, and surrounds, both the magnetic device and the data storage arrangement, and wherein the magnetic device is relatively distal to the data storage arrangement.

16. The integrated circuit arrangement of claim 1, frirther comprising a write circuit adapted to write a logic state to at least one of the plurality of mini magnets by magnetizing the at least one mini magnet, the logic state being susceptible to being changed in response to the local magnetic field.

17. The integrated circuit arrangement of claim 16, wherein the write circuitry is adapted to write a first logic state to the at least one mini magnet by magnetizing the mini magnet in a first direction, and to write a second logic state to the at least one mini magnet by magnetizing the mini magnet in a second direction.

18. The integrated circuit arrangement of claim 1, wherein the magnetic device is adapted to generate a local magnetic field that sets a magnetic state of at least one of the mini magnets in response to a portion of the integrated circuit package being removed.

19. The integrated circuit arrangement of claim 18, wherein the magnetic device is adapted to generate a local magnetic field that sets the magnetic state of at least one of the mini magnets to a first magnetic state.

20. The integrated circuit arrangement of claim 19, wherein the magnetic device is adapted to generate a local magnetic field that switches the magnetic state of the at least one of the mini magnets from a second magnetic state to the first magnetic state.

21. An integrated circuit memory arrangement adapted to store data that is susceptible to data corruption caused by a local magnetic field, the integrated circuit arrangement comprising: a plurality of mini magnets adapted to store a logical state as a function of the magnetic state of the mini magnet; a plurality of word lines, each mini magnet being magnetically responsive to a signal applied to a word line for setting a magnetic state of the mini magnet; a plurality of sensing circuits, each sensing circuit exhibiting an electrical characteristic that is a function of the magnetic state of at least one of the mini magnets, the electrical characteristic being detectable for reading the logical state stored in the at least one of the mini magnets, an integrated circuit package including a magnetic device adapted to generate the local magnetic field with sufficiently strong fringe fields that, in response to the removal of a portion of the integrated circuit package, the local magnetic field sets the magnetic state of at least one of the mini magnets.

22. An anti-tamper arrangement adapted to protect a magnetically-responsive circuit node, the anti-tamper arrangement comprlslng: magnetic means for generating a local magnetic field and for directing the local magnetic field away from the magnetically-responsive circuit element; and the magnetic means further being adapted, in response to a portion of the magnetic means being removed, for generating a fringing magnetic field that causes the magnetically-responsive circuit node to take on a magnetic state.

* * * * *